(12) United States Patent
Takano

(10) Patent No.: US 6,580,958 B1
(45) Date of Patent: Jun. 17, 2003

(54) SEMICONDUCTOR MANUFACTURING APPARATUS AND DEVICE MANUFACTURING METHOD

(75) Inventor: Shin Takano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/444,515

(22) Filed: Nov. 22, 1999

(30) Foreign Application Priority Data

Nov. 25, 1998 (JP) .......................................... 10-349308

(51) Int. Cl.[7] .............................................. G06F 19/00
(52) U.S. Cl. ...................................... 700/121; 700/110
(58) Field of Search ................................ 700/112, 115, 700/121, 110, 214, 215, 219, 108, 109

(56) References Cited

U.S. PATENT DOCUMENTS

| | | | | |
|---|---|---|---|---|
| 5,751,581 A | * | 5/1998 | Tau et al. .................... | 700/115 |
| 5,842,824 A | * | 12/1998 | Nishi .................... | 414/225.01 |
| 5,980,591 A | * | 11/1999 | Akimoto et al. ........... | 29/25.01 |
| 6,078,845 A | * | 6/2000 | Friedman .................... | 700/104 |
| 6,259,960 B1 | * | 7/2001 | Inokuchi .................... | 700/110 |

FOREIGN PATENT DOCUMENTS

JP 5-73578 3/1993

* cited by examiner

*Primary Examiner*—Leo Picard
*Assistant Examiner*—Ryan Jarrett
(74) *Attorney, Agent, or Firm*—Fitzpatrick, Cella, Harper & Scinto

(57) ABSTRACT

Wafers are sequentially loaded, exposed, and unloaded. When a wafer exposed or being exposed is to be recovered in a carrier in a predetermined case, a storage section stores information for specifying the slot of the carrier in which the recovered wafer is stored and information associated with the wafer in correspondence with each other. When the wafer recovered is the first wafer recovered in the lot to which the wafer belongs, and a wafer is already present in the carrier, a new carrier is set in place of the wafer in accordance with an output, and the wafer is recovered in the new carrier.

6 Claims, 11 Drawing Sheets

| 503 | CARRIER 1 501 | 503 | CARRIER 2 502 |
|---|---|---|---|
| 1 | LOT A ( exam ) | 1 | NOTHING |
| 2 | LOT A ( exam ) | 2 | NOTHING |
| 3 | LOT A ( fail ) | 3 | NOTHING |
| 4 | LOT A ( fail ) | 4 | NOTHING |
| 5 | LOT A ( fail ) | 5 | NOTHING |
| 6 | LOT A ( exam ) | 6 | NOTHING |
| 7 | LOT B ( exam ) | 7 | NOTHING |
| 8 | LOT B ( exam ) | 8 | NOTHING |
| 9 | LOT C ( fail ) | 9 | NOTHING |
| 10 | LOT C ( exam ) | 10 | NOTHING |
| 11 | LOT C ( exam ) | 11 | NOTHING |
| 12 | LOT C ( exam ) | 12 | NOTHING |
| 13 | LOT F ( exam ) | 13 | NOTHING |
| 14 | LOT F ( fail ) | 14 | NOTHING |
| 15 | NOTHING | 15 | NOTHING |
| 16 | NOTHING | 16 | NOTHING |
| 17 | NOTHING | 17 | NOTHING |
| 18 | NOTHING | 18 | NOTHING |

FIG. 6

| | | |
|---|---|---|
| CARRIER No. | : | 1 |
| SLOT No. | : | 3 |
| LOT ID | : | Lot A |
| MACHINE ID | : | # 2002 (i5) |
| PRODUCT NAME | : | MAGNETIC HEAD |
| PROCESS NAME | : | M & E |
| LOT PROCESS START TIME | : | 15 : 03 : 53 |
| WAFER RECOVERY TIME | : | 15 : 27 : 12 |

NOTE

SEMICONDUCTOR MANUFACTURING APPARATUS AND DEVICE MANUFACTURING METHOD

BACKGROUND OF THE INVENTION

The present invention relates to a semiconductor manufacturing apparatus for managing lots of a plurality of inline lot processes when a wafer which is undergoing the lot process is recovered to a carrier for the purpose of recovering defective wafers or examination of printed patterns, and a device manufacturing method using the apparatus.

Conventionally, in inline conveyance of a semiconductor manufacturing apparatus, there are cases where the apparatus recovers a defective wafer (wafer that is being exposed) produced at odd intervals or recovers a wafer (exposed wafer) for examination of printed patterns in a prescribed cycle during a plurality of lot processes by instruction of a console. Thus, the wafer is recovered to a carrier even when a wafer of another lot is already present in the carrier. That is, wafers are recovered to the same carrier independently of their lots.

According to the above operation, however, the operator must record information related to the lots processes of each of the wafers in the carrier, and unclear information of each of the lots processes sometimes occurs. In this case, the operation efficiency of the operator becomes low, resulting in trouble in the re-process or lot management of recovered wafers.

SUMMARY OF THE INVENTION

The present invention has been made in consideration of the above situation, and has as its object to allow an efficient re-process of recovered wafers in a semiconductor manufacturing apparatus and a device manufacturing method using the apparatus.

In order to achieve the above object, according to an aspect of the present invention, there is provided a semiconductor manufacturing apparatus comprising exposure means for sequentially loading wafers, exposing the wafers, and unloading the wafers, and recovery means for recovering a wafer exposed or being exposed in a carrier in a predetermined case, and comprising storage means for storing information for specifying a slot of the carrier in which the wafer to be recovered is stored and information associated with the wafer in correspondence with each other.

According to the aspect of the present invention, there is also provided a device manufacturing method comprising the steps of sequentially loading wafers, exposing the wafers, and unloading the wafers by exposure means of this semiconductor manufacturing apparatus, and when a wafer exposed or being exposed is to be recovered in a carrier in a predetermined case by recovery means of the semiconductor manufacturing apparatus, storing information for specifying a slot of the carrier in which the wafer to be recovered is stored and information associated with the wafer in correspondence with each other by storage means of the semiconductor manufacturing apparatus.

According to the semiconductor manufacturing apparatus or device manufacturing method of the aspect of the present invention, since the information for specifying the slot in which the recovered wafer is stored and the information associated with the wafer are stored, the recovered wafer is efficiently re-processed by referring to the pieces of information. In addition, since the information associated with the wafer includes information for specifying the lot of the wafer, the lots of recovered wafers can be managed in units of slots.

According to another aspect of the present invention, there is also provided a semiconductor manufacturing apparatus having exposure means for sequentially loading wafers, exposing the wafers, and unloading the wafers, and recovery means for recovering a wafer exposed or being exposed in a carrier in a predetermined case, wherein when it is determined in recovering the wafer that the wafer to be recovered is the first wafer to be recovered in a lot to which the wafer belongs, and a wafer is already present in the carrier, the recovery means outputs a message and then recovers the wafer to be recovered in a new carrier upon detecting that the new carrier is set in place of the carrier.

According to another aspect of the present invention, there is also provided a semiconductor manufacturing apparatus comprising the steps of sequentially loading wafers, exposing the wafers, and unloading the wafers by exposure means of this semiconductor manufacturing apparatus, when recovery means is to recover a wafer exposed or being exposed in a carrier in a predetermined case, and a message is output upon determining that the wafer to be recovered is the first wafer to be recovered in a lot to which the wafer belongs, and a wafer is already present in the carrier, setting a new carrier in place of the carrier in accordance with the output, and recovering the wafer to be recovered by the recovery means.

According to the semiconductor manufacturing apparatus or device manufacturing method according to another aspect of the present invention, since recovered wafers of different lots are prevented from being simultaneously present in one carrier, the recovered wafers can be efficiently re-processed. In other words, the lots of the recovered wafers can be managed in units of carriers.

Hence, according to the present invention, lot management of recovered wafers can be selected from management in units of carriers and that in units of slots.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENT

In a preferred embodiment of a semiconductor manufacturing apparatus or device manufacturing method of the present invention, information associated with a recovered wafer includes information for specifying the lot and process of the wafer. In addition, information for specifying a carrier that recovers the wafer is stored in correspondence with the information for specifying the lot and information associated with the wafer. Even when wafers are recovered to a plurality of carriers, the carrier can be easily specified, and the recovered wafer can be efficiently re-processed. The pieces of stored information are displayed such that the operator can refer to them.

In the present invention, a wafer exposed or being exposed is recovered to a carrier only in a predetermined case. For example, a wafer exposed or being exposed is recovered when it is abnormally exposed or a recovery instruction is input from an external device.

Figure 1:
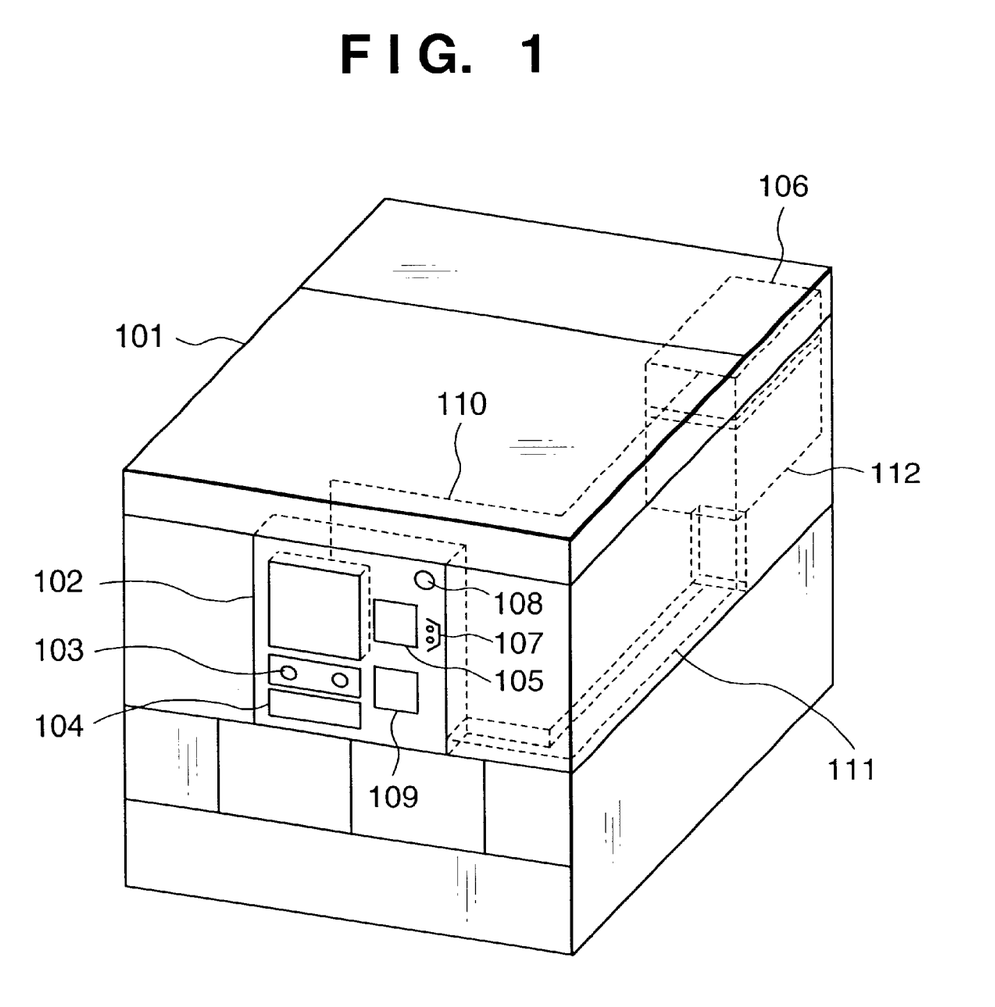
FIG. 1 is a perspective view showing the outer appearance of a semiconductor manufacturing apparatus according to an embodiment of the present invention.

FIG. 1 is a perspective view showing the outer appearance of the semiconductor manufacturing apparatus according to an embodiment of the present invention. In this embodiment, the present invention is applied to a semiconductor manufacturing apparatus operated by operating the switch section of an operation panel.

As shown in FIG. 1, this semiconductor manufacturing apparatus has a temperature-controlled chamber 101, EWS (Engineering WorkStation) main body 106 disposed in the chamber and having a CPU for controlling the apparatus main body, and a console section having an EWS display unit 102 for displaying predetermined information of the apparatus, monitor TV 105 for displaying image information obtained via an image sensing means in the apparatus main body, operation panel 103 for performing a predetermined input operation to the apparatus, and EWS keyboard 104. Referring to FIG. 1, reference numeral 107 denotes an ON/OFF switch; 108, an emergency stop switch; 109, various switches and a mouse; 110, a LAN communication cable; 111, an exhaust duct for removing heat from the console function; and 112, an exhaust unit of the chamber. The semiconductor manufacturing apparatus main body is disposed in the chamber 101. The EWS display unit 102 is a flat panel using EL (ElectroLuminescence), plasma, or a liquid crystal. The EWS display unit 102 is set on the front surface of the chamber 101 and connected at the EWS main body 106 via the LAN cable 110. The operation panel 103, keyboard 104, and monitor TV 105 are also mounted on the front surface of the chamber 101, so the same console operation as in the prior art can be done on the front surface of the chamber 101.

Figure 2:
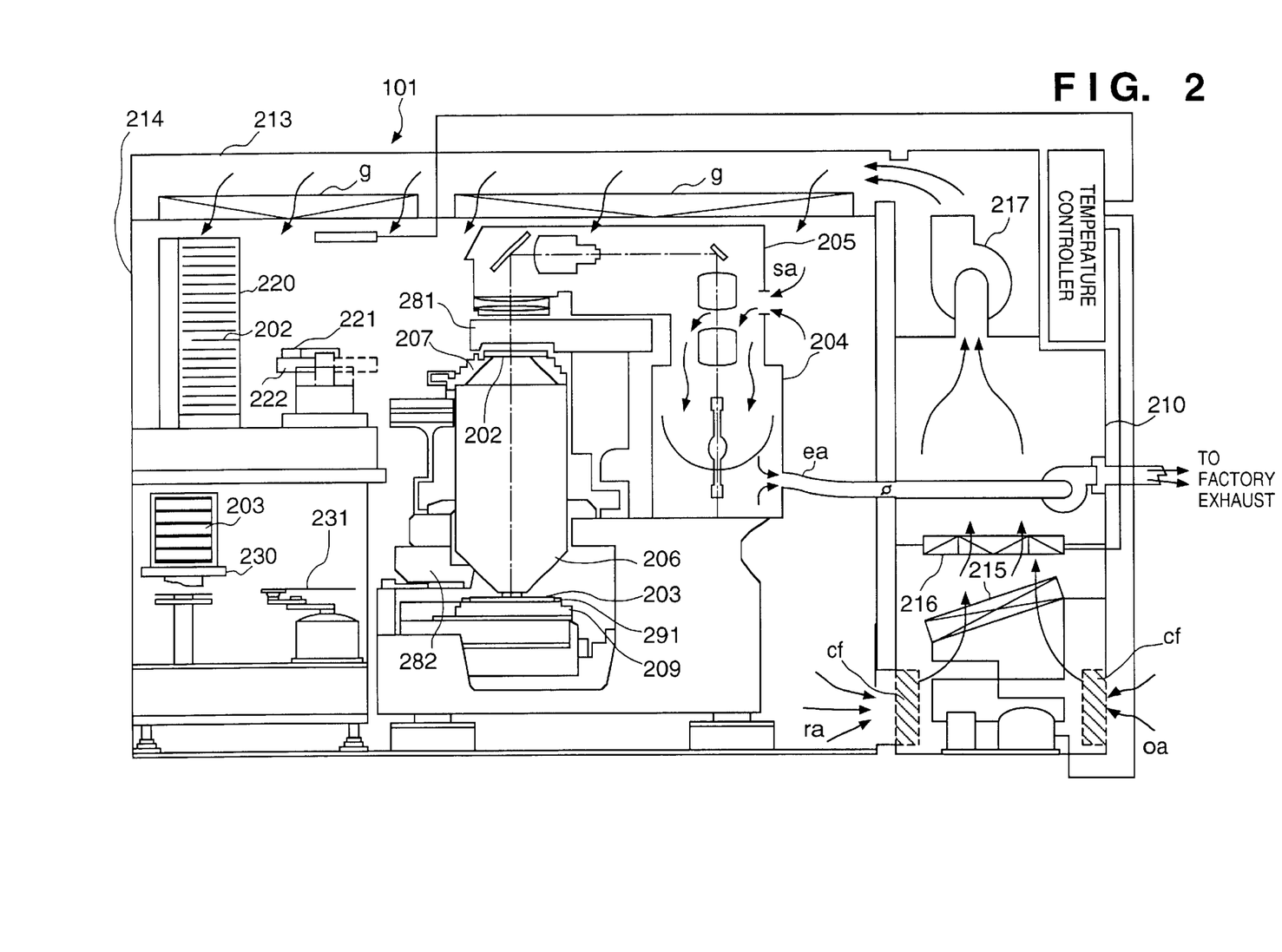
FIG. 2 is a view showing the internal structure of the apparatus shown in FIG. 1.

FIG. 2 is a view showing the internal structure of the apparatus shown in FIG. 1. FIG. 2 shows a stepper as a semiconductor manufacturing apparatus. Referring to FIG. 2, reference numeral 202 denotes a reticle; and 203, a wafer. When the reticle 202 is illuminated with a light beam from a light source unit 204 via an illumination optical system 205, the pattern on the reticle 202 can be transferred to the photosensitive layer on the wafer 203 through a projecting lens 206. The reticle 202 is supported by a reticle stage 207 for holding and moving the reticle 202. The wafer 203 is exposed while being vacuum-chucked by a wafer chuck 291. The wafer chuck 291 can be moved in each axial direction which is perpendicular at the optical axis of the projection lens 206 by a wafer stage 209. A reticle optical system 281 for detecting the misalignment amount of the reticle is disposed above the reticle 202. An off-axis microscope 282 is disposed adjacent to the projecting lens 206 above the wafer stage 209. The off-axis microscope 282 mainly detects the relative position between an internal reference mark and an alignment mark on the wafer 203.

A reticle library 220 and wafer carrier elevator 230 as peripheral units are adjacent to the stepper main body. A necessary reticle and wafer are conveyed to the stepper main body by a reticle convey unit 221 and wafer convey unit 231, respectively.

The chamber 101 is constructed by an air conditioning room 210 for mainly adjusting the temperature of air, filter box 213 for filtering foreign substances with micosizes and forming a uniform flow of clean air, and booth 214 for shielding the apparatus environment from the outer atmosphere. In the chamber 101, air whose temperature is adjusted by a cooler 215 and re-heater 216 in the air conditioning room 210 is supplied into the booth 214 by a fan 217 through an air filter g. The air supplied to the booth 214 returns from a return port ra into the air conditioning room 210. Hence, the air circulates in the chamber 101. Normally, the chamber 101 does not build a perfect circulation system. To always keep a positive pressure in the booth 214, air outside the booth 214 is introduced from an outer air introduction port oa of the air conditioning room 210 through the fan in an amount corresponding to about 10% of the circulating air amount. This arrangement makes it possible to maintain a predetermined ambient temperature of the apparatus and keep the air clean.

The light source unit 204 has a suction port sa and exhaust port ea to cool the ultrahigh-pressure mercury lamp or remove any toxic gas due to abnormality of the laser. Hence, the air in the booth 214 is partially forcibly exhausted to the factory facility through the booth 214 via a dedicated exhaust fan of the air conditioning room 210. A chemical absorption filter cf for removing chemical substances in the air is connected to the outer air introduction port oa and return port ra of the air conditioning room 210.

Figure 3:
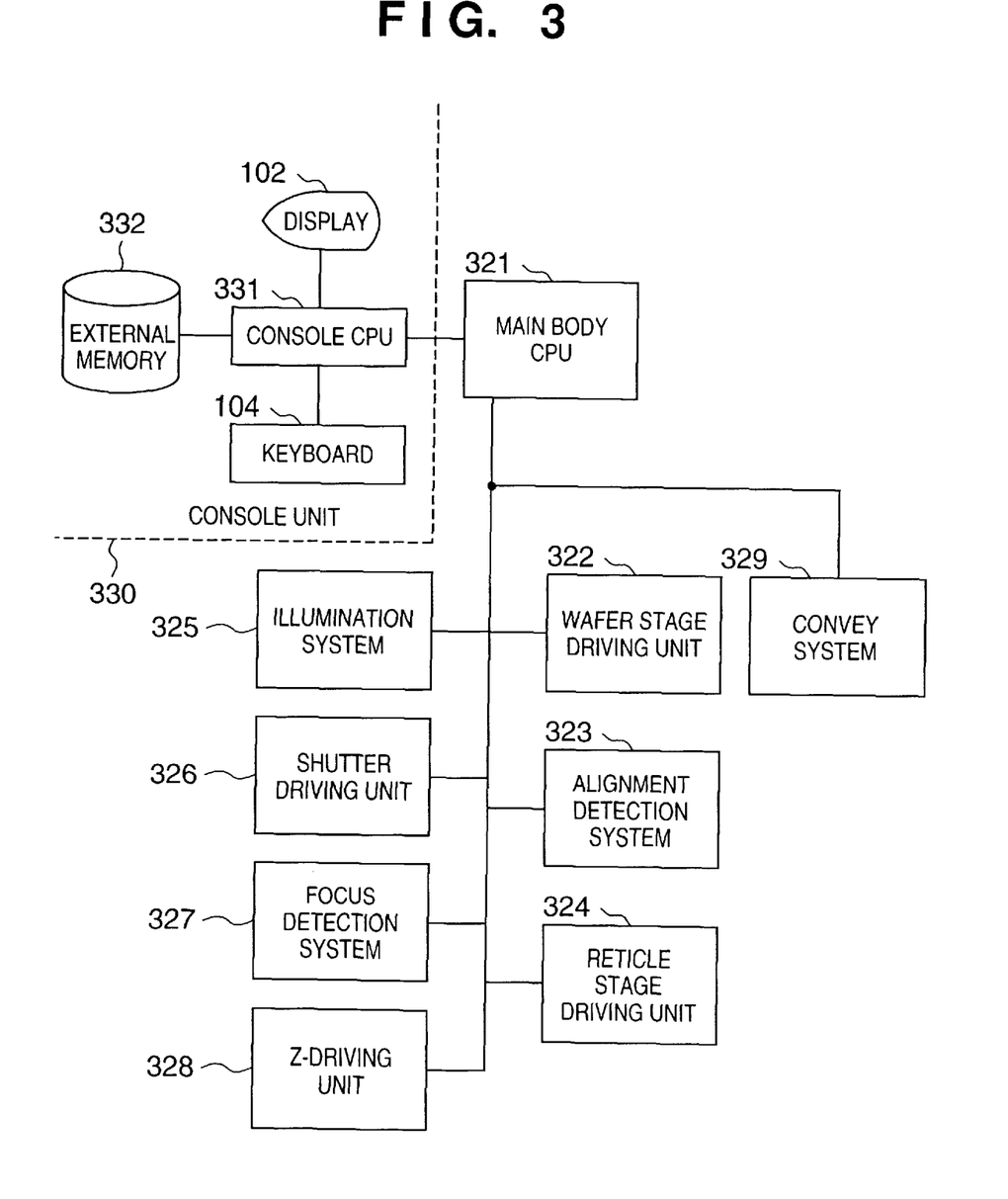
FIG. 3 is a block diagram showing the electrical circuit arrangement of the apparatus shown in FIG. 1.

FIG. 3 is a block diagram showing the electrical circuit arrangement of the apparatus shown in FIG. 1. Referring to FIG. 3, a main body CPU 321 incorporated in the EWS main body 106 controls the entire apparatus. The main body CPU 321 is formed from a central arithmetic unit such as a microcomputer or minicomputer. A wafer stage driving unit 322, alignment detection system 323 such as the off-axis microscope 282, reticle stage driving unit 324, illumination system 325 such as the light source unit 204, shutter driving unit 326, focus detection system 327, and Z-driving unit 328 are controlled by the main body CPU 321. Reference numeral 329 denotes a convey system such as the reticle convey unit 221 or wafer convey unit 231. A console unit 330 has the display 102, keyboard 104, graphic board, and console CPU 331 and supplies to the main body CPU 321 various commands or parameters associated with the operation of the exposure apparatus. That is, the console unit exchanges information with the operator. An external memory 332 such as a hard disk has a database in which various parameters, management data thereof, operator groups, and the like are recorded.

Figure 4:
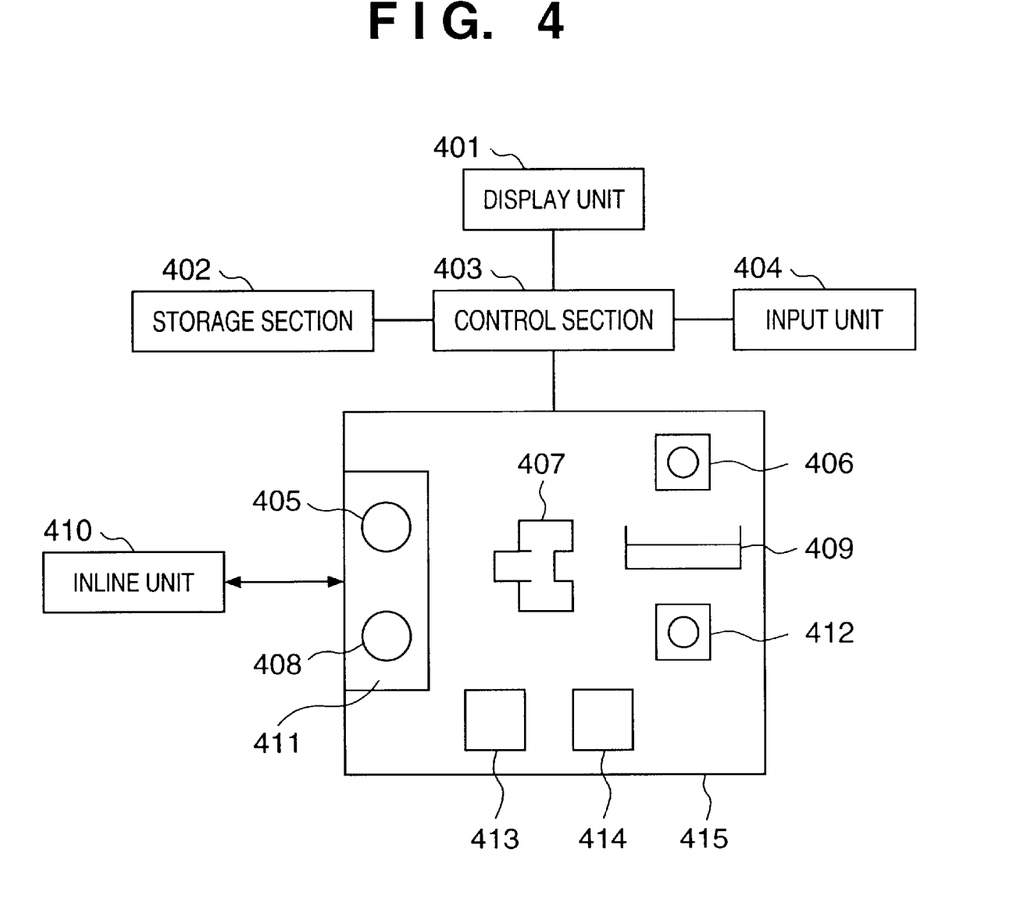
FIG. 4 is an explanatory view showing a main part of the apparatus shown in FIG. 1, which is particularly associated with the present invention.

FIG. 4 is an explanatory view showing a main part of the semiconductor manufacturing apparatus, which is particularly associated with the present invention. As shown in FIG. 4, this semiconductor manufacturing apparatus has an inline loading station 408 for transferring a wafer processed for exposure to the exposure process, mechanical pre-alignment unit 412 for mechanically pre-aligning the wafer, wafer stage 406 for driving the wafer to the exposure position, transfer hand 409 for transferring the mechanically pre-aligned wafer to the wafer stage 406, and inline unloading station 405 for transferring the exposed wafer to the next process. The inline unloading and loading stations 405 and 408 form an inline transfer unit 411.

The semiconductor manufacturing apparatus also has two carriers 413 and 414 which recover a wafer exposed or being exposed in a predetermined case, storage section 402 for storing pieces of information including the slot number of the carrier 413 or 414 storing a recovered wafer, the lot ID of the wafer, process name, and the carrier number of the carrier 413 or 414 that has recovered the wafer in correspondence with each other, display unit 401 for displaying these pieces of information stored in the storage section 402, control section 403 for controlling the entire stepper, input unit 404 for inputting an instruction to the stepper (semiconductor manufacturing apparatus), and loading hand 407 for transferring a wafer to the carrier 413 or 414 or the inline transfer unit 411. The carriers 413 and 414 are placed on a carrier elevator. The carrier elevator movies the carriers to the wafer extraction or storage positions.

The semiconductor manufacturing apparatus also has an inline unit 410 as a coater (resist application section)/ developer (development processing section).

Figure 5:
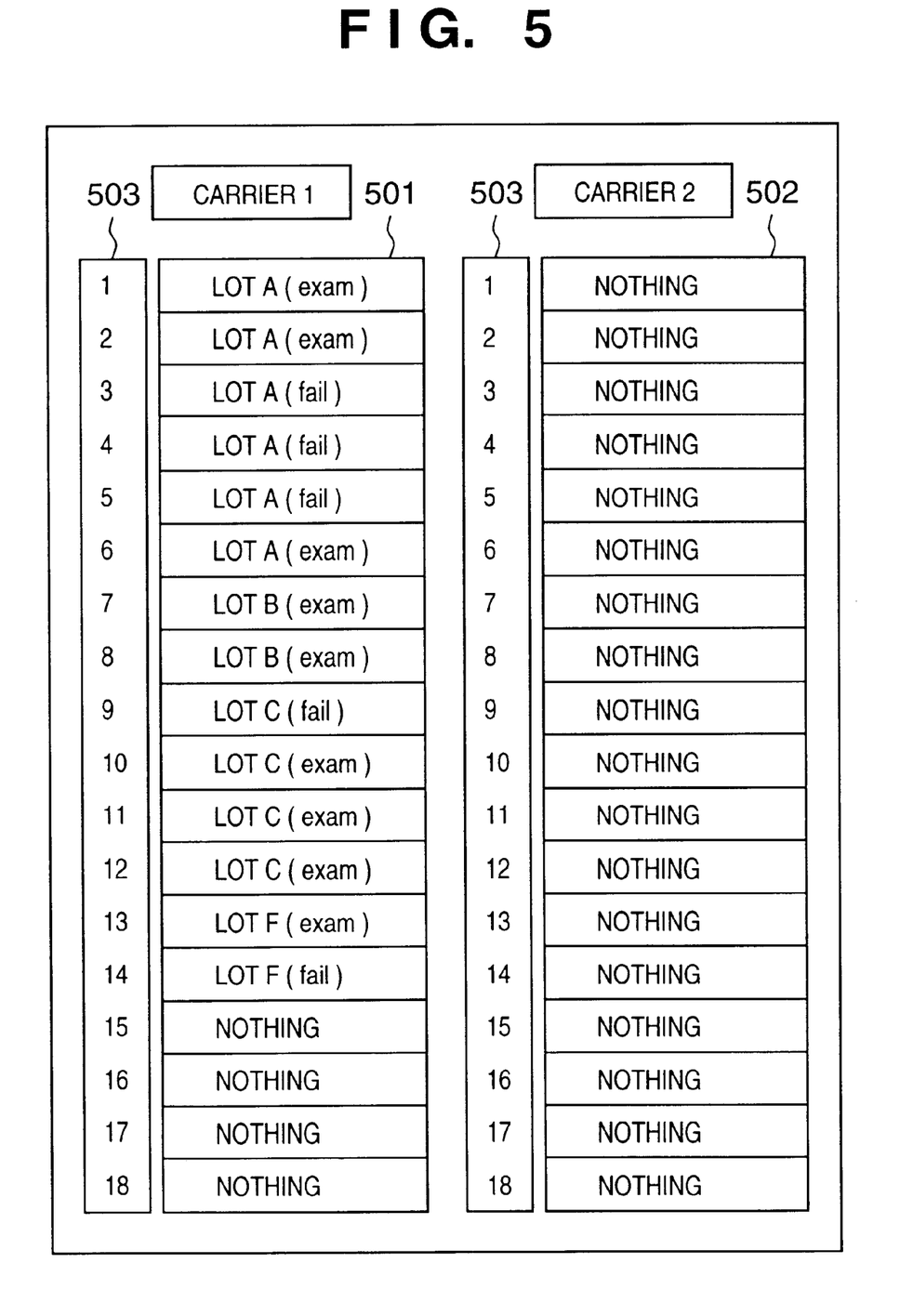
FIG. 5 is a view showing a display window of a display unit which displays the situation of recovered wafers in the carriers of the apparatus shown in FIG. 1.

FIG. 5 is a view showing a display window of the display unit 401 which displays the situation of recovered wafers in the carriers 414 and 413 on the basis of the above-described information stored in the storage section 402 when processing shown in FIG. 8 (to be described later) is to be executed. FIG. 5 shows lot management for recovered wafers. In this display window, the carrier 414 is displayed as "carrier 1", and the carrier 413 is displayed as "carrier 2". The slot numbers of each carrier are displayed on a slot number display portion 503. In addition, pieces of information for managing the recovered wafers, including the lot numbers (e.g., "LOT A" and "LOT B") of the wafers stored in these slots and reasons for recovery (e.g., "exam" and "fail"), are displayed on wafer information display portions 501 and 502. "Nothing" is displayed for empty slots.

Figure 6:
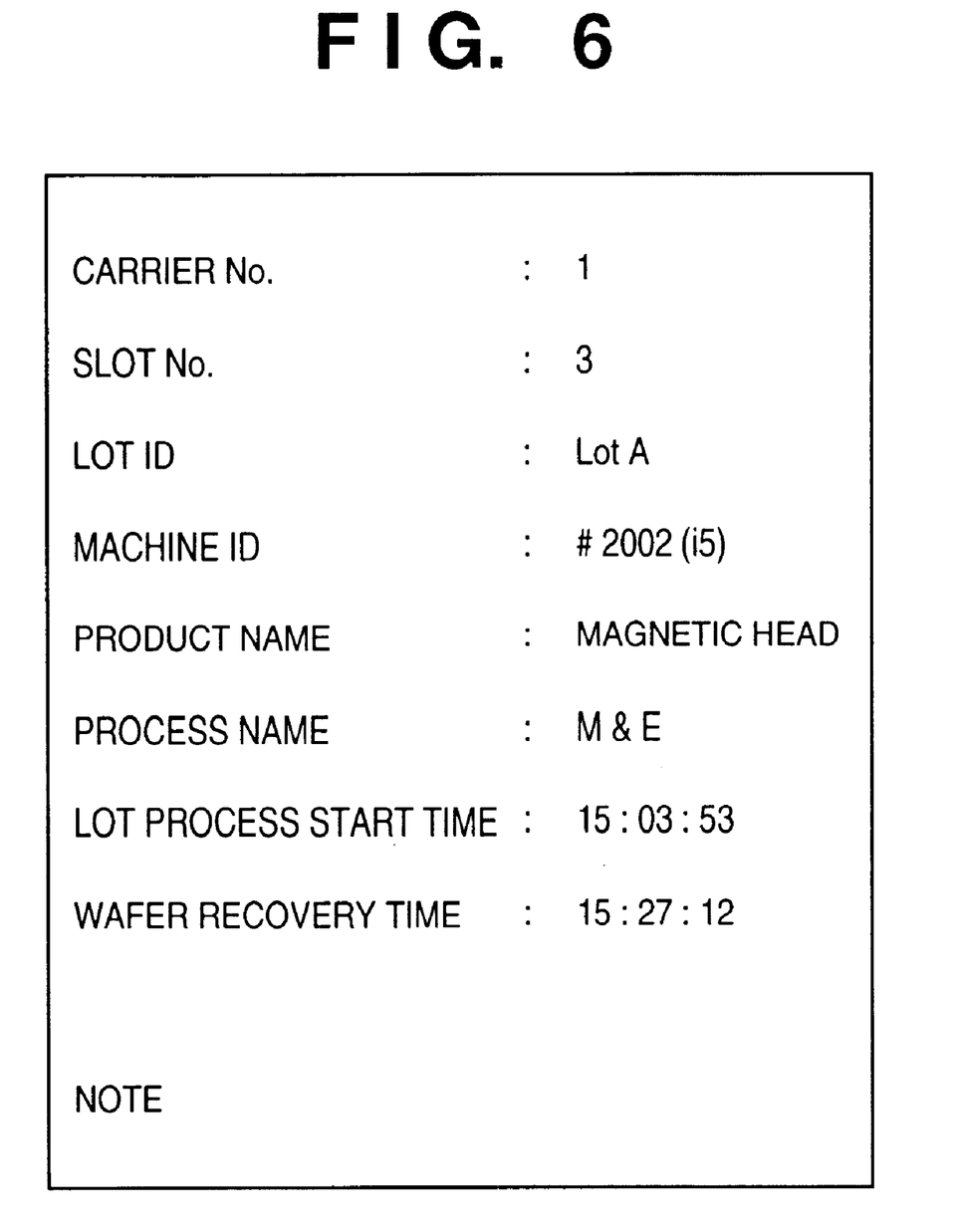
FIG. 6 is a view showing a display window of the display unit which displays detailed information of recovered wafers stored in the slots of the carriers of the apparatus shown in FIG. 1.

FIG. 6 is a view showing a display window of the display unit 401 which displays detailed information of recovered wafers stored in the slots of the carriers 413 and 414. When one of the displayed slots shown in FIG. 5 is clicked, these pieces of information about the recovered wafer stored in the slot are displayed.

Figure 7:
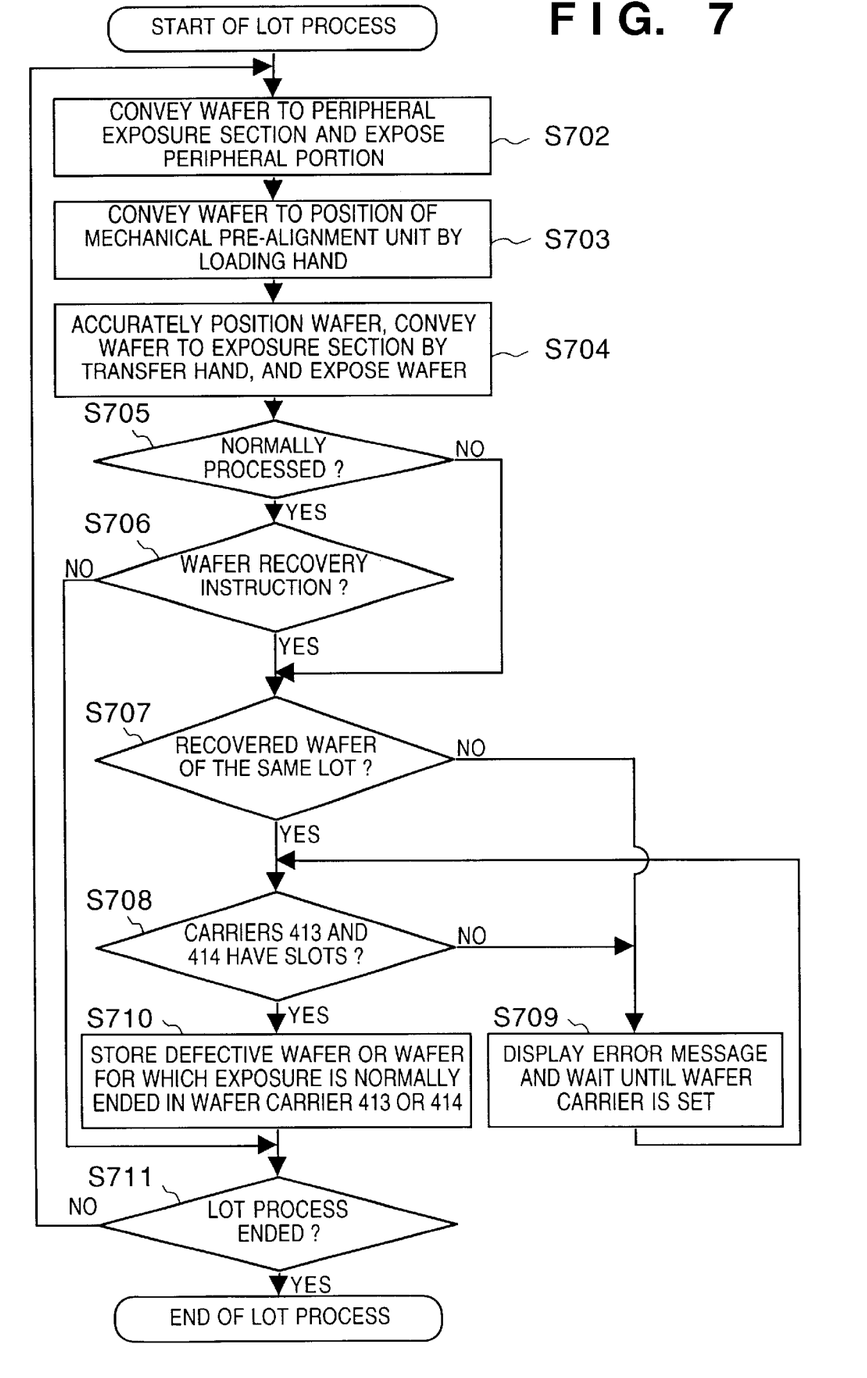
FIG. 7 is a flow chart showing exposure operation of the apparatus shown in FIG. 4, in which lot management control for recovered wafers of a plurality of lot processes is performed.

FIG. 7 is a flow chart showing the exposure operation of the apparatus shown in FIG. 4, in which lot management control for recovered wafers of a plurality of lot processes is performed. As shown in FIG. 7, first, a wafer applied with a resist is conveyed to a peripheral exposure section (not shown) of the semiconductor manufacturing apparatus by the inline unit 410 to expose the peripheral portion (step S702). The wafer whose peripheral portion is exposed is conveyed to the mechanical pre-alignment unit 412 by the loading hand 407 via the inline loading station 408 of the inline transfer unit 411 (step S703). The wafer is accurately positioned and conveyed onto the wafer stage 406 by the transfer hand 409, and exposed (step S704). It is monitored whether the exposure process is normally performed (step S705). When the wafer is not normally processed due to, e.g., an error during exposure (NO in step S705), the flow advances to step S707 to recover the wafer. On the other hand, when the exposure process is normally ended (YES in step S705), the flow advances to step S706.

It is determined in step S706 whether a wafer recovery instruction is input from the input unit 404 for, e.g., examination of printed patterns. When no wafer recovery instruction is input (NO in step S706), the flow advances to step S711. When a wafer recovery instruction is input (YES in step S706), the flow advances to step S707.

It is determined in step S707 whether the wafer to be recovered is in the same lot as that of previously recovered wafers. If it is determined that the wafer is in the same lot as that of the previously recovered wafers (YES in step S707), the flow advances to step S708. When it is not determined that the wafer is in a different lot (NO in step S708), i.e., the wafer to be recovered is the first lot process wafer in the lot to which the wafer belongs, an error message is displayed. Processing waits until the carriers 413 and 414 are exchanged for new empty carriers (step S709). After exchange, the flow advances to step S708.

It is confirmed in step S708 whether the wafer carriers 413 and 414 that have been set have empty slots. When an empty slot is present (YES in step S708), the flow advances to step S710. When no empty slots are present (NO in step S708), an error message is displayed, and processing waits until the wafer carriers 413 and 414 are exchanged for carriers with empty slots. When carriers with empty slots are set, the flow advances to step S710 via step S708.

In step S710, the wafer to be recovered is stored in the carrier 413 or 414 as a wafer for which exposure is normally ended or a defective wafer (step S710), and the flow advances to step S711.

It is determined in step S711 whether the lot process is ended. When the lot process has not been ended (NO in step S711), the flow returns to step S702. When the lot process is ended (YES in step S711), processing is ended.

According to this flow, first, it is determined that the wafer to be recovered is not in the same lot as that of the previously recovered wafers. Then, the wafer to be recovered is the first lot process wafer in the lot to which the wafer belongs, an error message is displayed, and processing waits until the carriers 413 and 414 are exchanged for new empty carriers. This prevents recovered wafers of a plurality of lots from being simultaneously present in one carrier.

Figure 8:
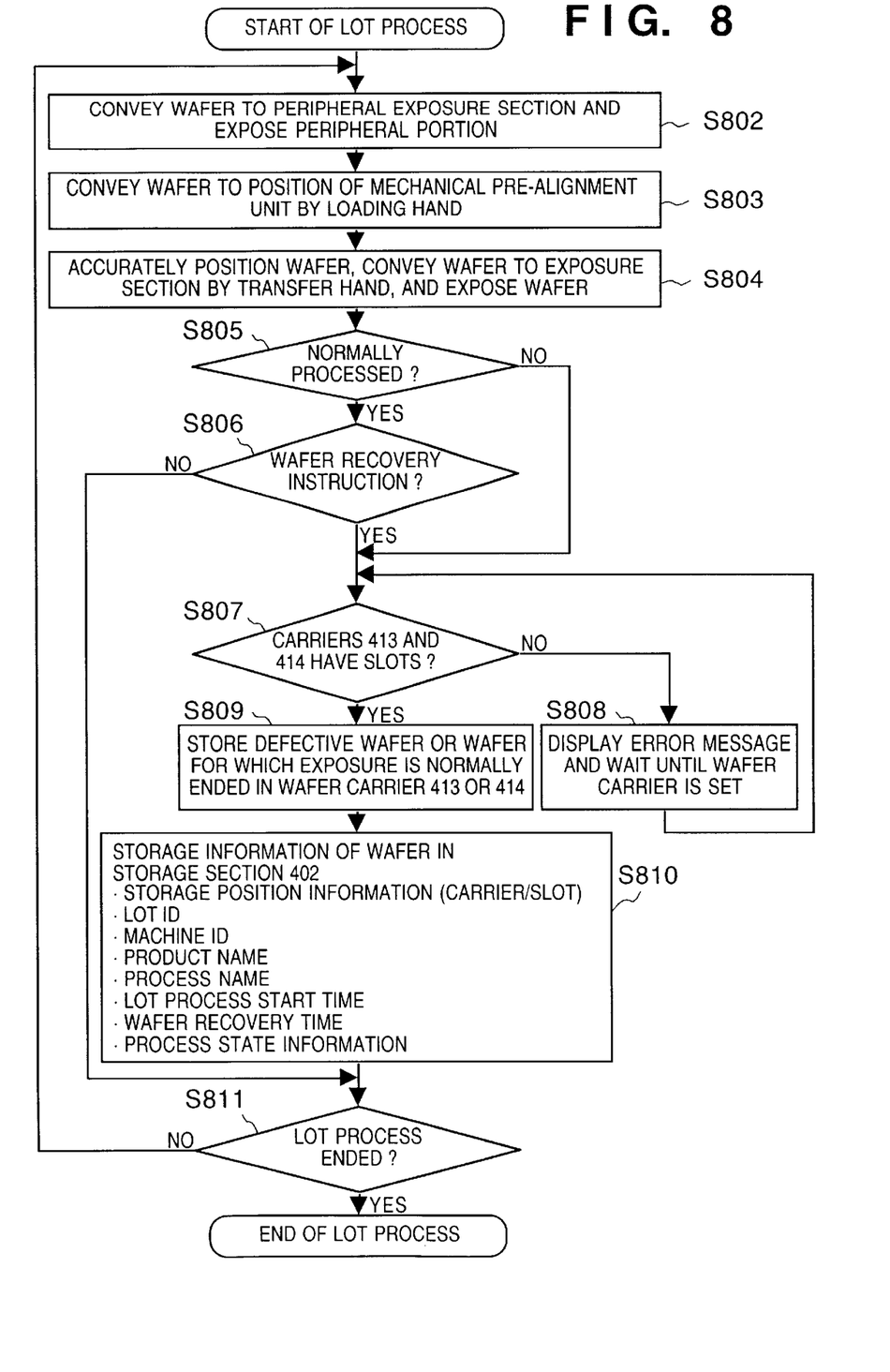
FIG. 8 is a flow chart showing another exposure operation of the apparatus shown in FIG. 4, in which another lot management control for recovered wafers of a plurality of lot processes is performed.

FIG. 8 is a flow chart showing another operation of the exposure apparatus of the apparatus shown in FIG. 4, in which another lot management control for recovered wafers of a plurality of lot processes is performed. In this control, first, a wafer applied with a resist is conveyed to a peripheral exposure section (not shown) of the semiconductor manufacturing apparatus by the inline unit 410 to expose the peripheral portion (step S802). The wafer whose peripheral portion is exposed is conveyed to the mechanical pre-alignment unit 412 by the loading hand 407 via the inline loading station 408 of the inline transfer unit 411 (step S803). The wafer is accurately positioned and conveyed onto the wafer stage 406 by the transfer hand 409, and exposed (step S804). It is monitored whether the exposure process is normally performed (step S805). When the exposure process is normally ended (YES in step S805), the flow advances to step S806. On the other hand, when the wafer is not normally processed due to, e.g., an error during exposure (NO in step S805), the flow advances to step S807 to recover the wafer.

It is determined in step S806 whether a wafer recovery instruction is input from the input unit 404 for, e.g., examination of printed patterns. When no wafer recovery instruction is input (NO in step S806), the flow advances to step S811. When a wafer recovery instruction is input (YES in step S806), it is confirmed whether the carriers 413 and 414 have empty slots (step S807). When an empty slot is present (YES in step S807), the flow advances to step S809. On the other hand, when no empty slots are present (NO in step S807), an error message is displayed, and processing waits until the carriers 413 and 414 are exchanged with new carriers with empty slots (step S808). When carriers with empty slots are set, the flow advances to step S809 via step S807.

In step S809, the wafer to be recovered is stored in the carrier 413 or 414 as a wafer for which exposure is normally ended or a defective wafer. Pieces of information including the slot number and lot ID of the stored wafer are stored in the storage section 402 (step S810), and the flow advances to step S811.

It is determined in step S811 whether the lot process is ended. When the lot process has not been ended (NO in step S811), the flow returns to step S802. When the lot process is ended (YES in step S811), processing is ended.

Figure 9:
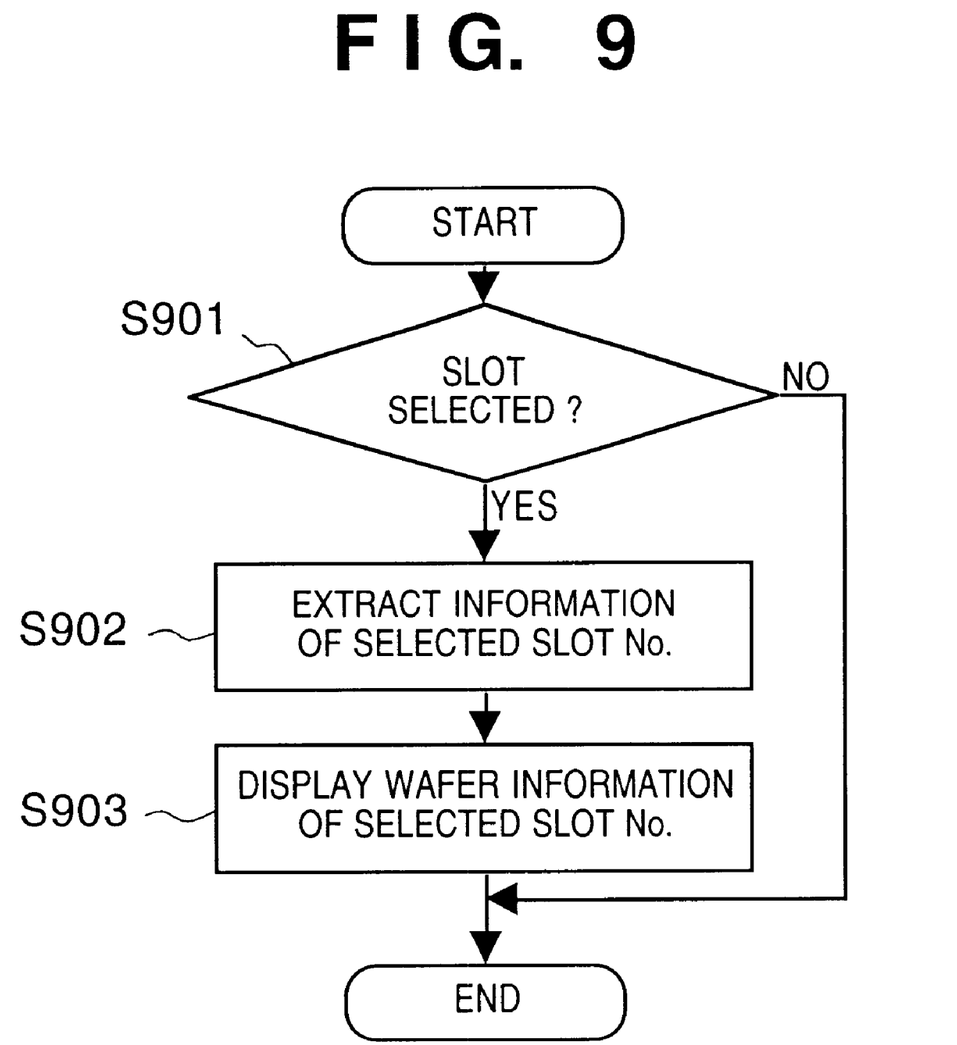
FIG. 9 is a flow chart showing processing of displaying information about a recovered wafer stored in a given slot when the slot displayed in the display window shown in FIG. 5 is clicked.

FIG. 9 is a flow chart showing processing of displaying information about a recovered wafer stored in a given slot when the slot displayed in the display window shown in FIG. 5 is clicked during processing shown in FIG. 8. In this processing, it is determined first whether the graphic of any one of slots with numbers in the wafer information display portions 501 and 502 in FIG. 5, which are shown on the display unit 401, is selected (clicked) (step S901). If it is determined that no slot is selected (NO in step S901), processing is ended. When it is determined that a slot is selected (YES in step S901), the flow advances to step S902. In step S902, pieces of information of a wafer corresponding to the selected slot number are extracted from the storage section 402. In step S903, the extracted pieces of wafer information are displayed on the display unit 401 in the format shown in FIG. 6, and processing is ended.

The operator can efficiently and appropriately re-process recovered wafers by referring to the displayed information.

As has been described above, according to this embodiment, information for specifying the slot of a carrier in which a recovered wafer is stored and information associated with the wafer, including the lot ID, are stored in correspondence with each other. For this reason, management of recovered wafers of a plurality of lots can be properly and efficiently managed, and errors or cumbersomeness in wafer lot management for the re-process of recovered wafers can be prevented. Hence, the recovered wafers can be efficiently re-processed.

When it is determined that the wafer to be recovered is the first wafer to be recovered in the lot to which the wafer belongs, and wafers are already present in the carrier for recovering wafers, a message representing this is output. After that, when it is detected that a new carrier is set in place of the carrier, the wafer is recovered in the new carrier. This prevents recovered wafers of a plurality of lots from being simultaneously present in one carrier. Hence, when the operator instructs to recover a wafer exposed or being exposed, a plurality of lots can be prevented from being simultaneously present in one carrier without managing the lots of the wafers recovered in the carrier by himself/herself. For this reason, errors in lot management of wafers to be re-processed can be prevented, and the recovered wafers can be efficiently re-processed.

<Embodiment of Device Manufacturing Method>

Figure 10:
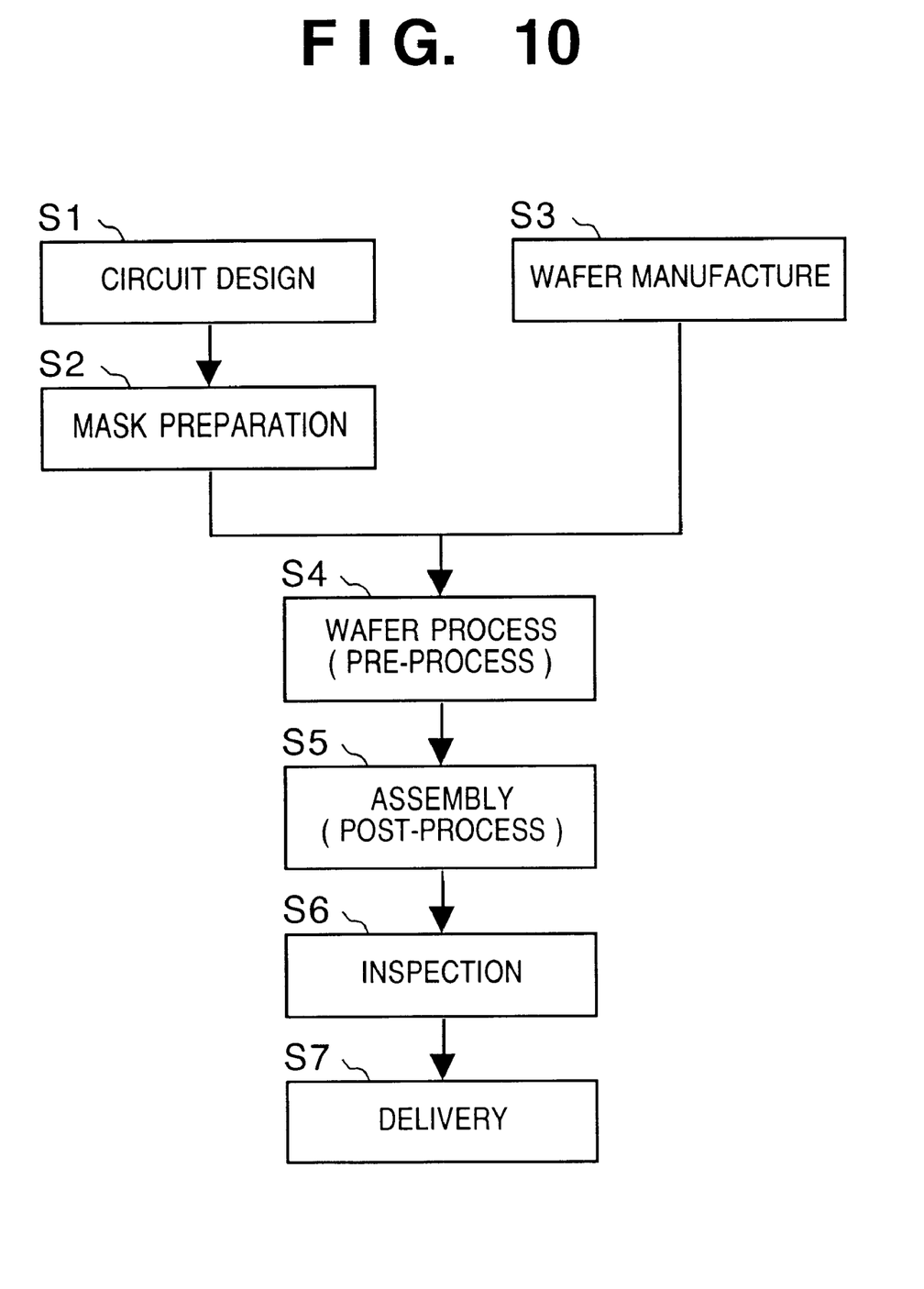
FIG. 10 is a flow chart showing a device manufacturing method using the exposure apparatus of the present invention.

An embodiment of a device manufacturing method using the above-described semiconductor manufacturing method will be described next. FIG. 10 shows the flow of manufacturing a microdevice (e.g., a semiconductor chip such as an IC or an LSI, a liquid crystal panel, a CCD, a thin-film magnetic head, or a micromachine). In step 1 (circuit design), the pattern of a device is designed. In step 2 (mask preparation), a mask having the designed pattern is prepared. In step 3 (wafer manufacture), a wafer is manufactured using a material such a silicon or glass. In step 4 (wafer process) called a preprocess, an actual circuit is formed on the wafer by lithography using the prepared mask and wafer. In step 5 (assembly) called a post-process, a semiconductor chip is formed from the wafer prepared in step 4. This step includes processes such as assembly (dicing and bonding) and packaging (chip encapsulation). In step 6 (inspection), inspections including an operation check test and a durability test of the semiconductor device manufactured in step 5 are performed. A semiconductor device is completed with these processes and delivered (step 7).

Figure 11:
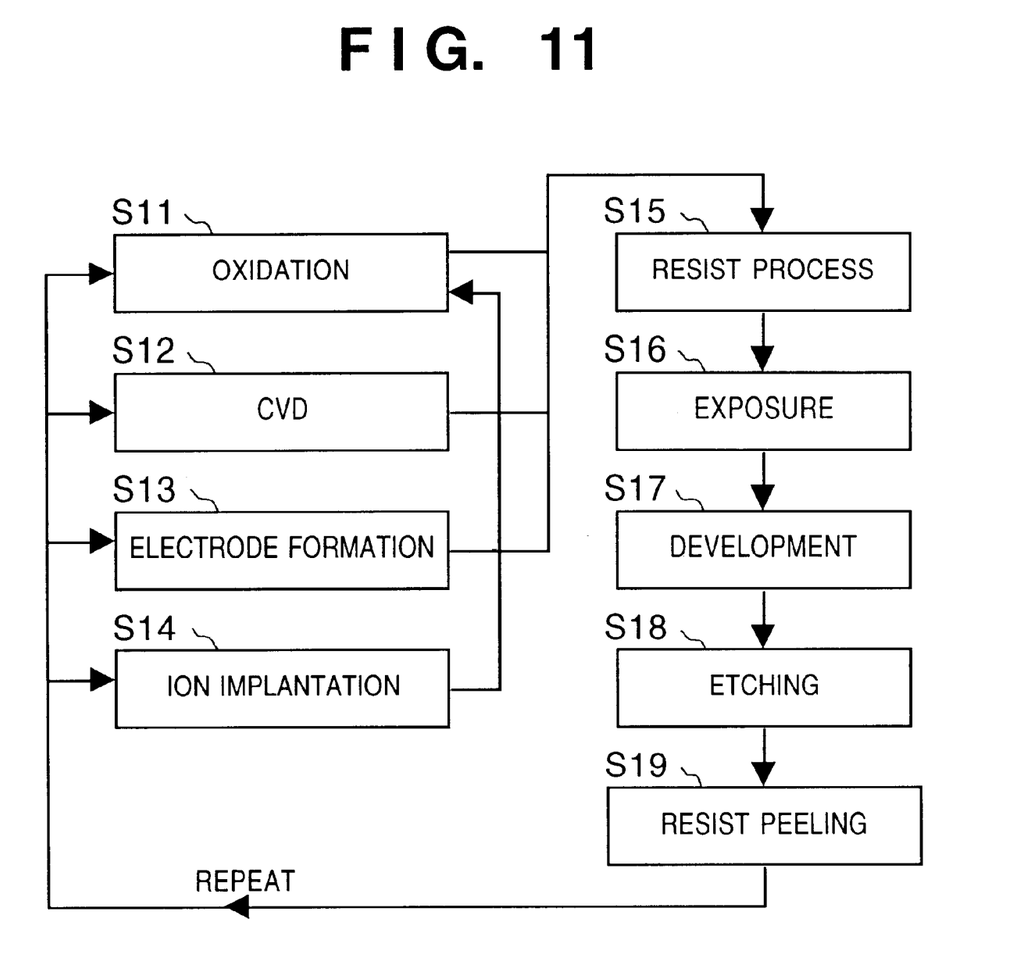
FIG. 11 is a flow chart showing details of the wafer process shown in FIG. 10.

FIG. 11 shows details of the wafer process (step 4). In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted into the wafer. In step 15 (resist process), a resist is applied to the wafer. In step 16 (exposure), the circuit pattern of the mask is printed in a plurality of shot regions of the wafer by exposure using the above-described exposure apparatus or exposure method. In step 17 (development), the exposed wafer is developed. In step 18 (etching), portions other than the developed resist image are etched. In step 19 (resist peeling), any unnecessary resist remaining after etching is removed. By repeating these steps, a multilayered structure of circuit patterns is formed on the wafer.

When the production method of this embodiment is used, a large device which is conventionally difficult to manufacture can be manufactured at low cost.

As has been described above, according to this embodiment, information for specifying the slot of a carrier in which a recovered wafer is stored and information associated with the wafer, including the lot ID, are stored in correspondence with each other. For this reason, management of recovered wafers of a plurality of lots can be properly and efficiently managed, and errors or cumbersomeness in wafer lot management for the re-process of recovered wafers can be prevented. Hence, the recovered wafers can be efficiently re-processed.

When it is determined that the wafer to be recovered is the first wafer to be recovered in the lot to which the wafer belongs, and wafers are already present in the carrier for recovering wafers, a message representing this is output. After that, when it is detected that a new carrier is set in place of the carrier, the wafer is recovered in the new carrier. This prevents recovered wafers of a plurality of lots from being simultaneously present in one carrier. Hence, when the operator instructs to recover a wafer exposed or being exposed, a plurality of lots can be prevented from being simultaneously present in one carrier without managing the lots of the wafers recovered in the carrier by himself/herself. For this reason, errors in lot management of wafers to be re-processed can be prevented, and the recovered wafers can be efficiently re-processed.

As many apparently widely different embodiments of the present invention can be made without departing from the spirit and scope thereof, it is to be understood that the invention is not limited to the specific embodiments thereof except as defined in the appended claims.

What is claimed is:

1. A semiconductor manufacturing apparatus for sequentially loading wafers in units of lots, performing processes on the wafers, and unloading the wafers, said apparatus comprising:

wafer recovery means for recovering a defective wafer and a wafer for examination in a carrier, wherein the carrier has a plurality of slots and can store each one of the wafers in each of the plurality of slots; and display means for displaying information regarding the wafers recovered in the carrier, wherein said display means displays a list having a lot number of a wafer stored in each of the plurality of slots and wafer information associated with whether the wafer is the defective wafer or the wafer for examination, in correspondence with each of the slot numbers of the carrier.

2. The apparatus according to claim 1, wherein said wafer recovery means has a plurality of carriers for recovering a wafer and determination means for determining in which of the plurality of carriers the wafer is recovered, on the basis of a lot number of the wafer.

3. The apparatus according to claim 1, wherein said display means further displays a carrier number of the carrier.

4. The apparatus according to claim 1, wherein said display means, when an operator designates one of the displayed slots in the list, displays detailed information of a wafer in the designated slot.

5. The apparatus according to claim 1, wherein the wafer recovered in the carrier is re-processed after the process in units of lots is completed.

6. A device manufacturing method comprising:

a loading step of sequentially loading wafers in units of lots;

an exposing step of exposing the wafers by a semiconductor manufacturing apparatus for performing processes on the wafers;

a wafer recovery step for recovering a defective wafer and a wafer for examination in a carrier, wherein the carrier has a plurality of slots and can store each one of the wafers in each of the plurality of slots;

an unloading step of unloading the wafers; and a display step for displaying information regarding the recovered wafers in the carrier, wherein said display step displays a list having a lot number of a wafer stored in each of the plurality of slots and wafer information associated with whether the wafer is the defective wafer or the wafer for examination, in correspondence with each of the slot numbers of the carrier.

* * * * *